*(12)* United States Patent
Reynaert et al.

(10) Patent No.: US 7,679,434 B2
(45) Date of Patent: Mar. 16, 2010

(54) AMPLIFIER MODULATION METHOD AND APPARATUS

(75) Inventors: Patrick Reynaert, Aartselaar (BE);
Andreas Wiesbauer, Pörtschach (AT);
Thomas Pötscher, Villach (AT); Koen Mertens, Villach (AT)

(73) Assignee: Infineon Technologies AG, Neubiberg (DE)

( * ) Notice: Subject to any disclaimer, the term of this patent is extended or adjusted under 35 U.S.C. 154(b) by 20 days.

(21) Appl. No.: 12/017,218

(22) Filed: Jan. 21, 2008

(65) Prior Publication Data

US 2009/0184761 A1 Jul. 23, 2009

(51) Int. Cl.
*H03F 3/38* (2006.01)
(52) U.S. Cl. .................................... 330/10; 330/207 A
(58) Field of Classification Search .............. 330/10, 330/207 A, 251
See application file for complete search history.

(56) References Cited

U.S. PATENT DOCUMENTS 4,649,565 A * 3/1987 Kaizer et al. ................ 330/251
7,368,986 B2 * 5/2008 Pillonnet ....................... 330/10

OTHER PUBLICATIONS

"RF and Microwave Power Amplifier and Transmitter Technologies—Part 2", Frederick H. Raab, Peter Asbeck, Steve Cripps, Peter B. Kinington, Zoya B. Popovich, Nick Pothecary, John F. Sevic and Nathan O. Sokal, High Frequency Electronics, High Frequency Design, RF Power Amplifiers, May 2003, pp. 22-36.

"Microwave Power Amplifiers", Advanced Techniques in RF Power Amplifier Design, Steve Cripps, Artech House Publisher 2$^{nd}$ Edition, pp. 257-298.
*RF Power Amplifiers for Wireless Communications*, "Efficiency Enhancement Techniques, Pulse Width Modulation (PWM)", Steve Cripps, Artech House, 2$^{nd}$ Edition, pp. 318-323.
"A Novel High-Efficiency Linear Transmitter Using Injection-Locked Pulsed Oscillator", Young-Sang Jeon, Hoe-Sung Yang and Sangwook Nam, IEEE Microwave and Wireless Components Letters, vol. 15, No. 4, Apr. 2005, pp. 214-216.
U.S. Appl. No. 11/958,849, filed Dec. 18, 2007, Thomas Potscher, Entire Document.
"Microwave Power Amplifiers", Advanced Techniques in RF Power Amplifier Design, Steve Cripps, Artech House Publisher 2$^{nd}$ Edition, pp. 257-298, Jun. 15, 2002.
*RF Power Amplifiers for Wireless Communications*, "Efficiency Enhancement Techniques, Pulse Width Modulation (PWM)", Steve Cripps, Artech House, 2$^{nd}$ Edition, pp. 318-323, Mar. 31, 1999.

* cited by examiner

*Primary Examiner*—Khanh V Nguyen
(74) *Attorney, Agent, or Firm*—Eschweiler & Associates, LLC

(57) ABSTRACT

One embodiment relates to a power amplifier that includes a switched mode power amplification stage. The power amplification stage has an output configured to provide an amplified output voltage as a function of a drive signal, where the drive signal fluctuates during a first time and is inactive during a second time. The power amplifier also includes impedance compensation circuitry coupled to the output of the power amplification stage. The impedance compensation circuitry can selectively alter an output impedance of the power amplification stage as a function of a control signal that is continuously de-asserted during the first time and continuously asserted during the second time. Other embodiments are also disclosed.

25 Claims, 7 Drawing Sheets

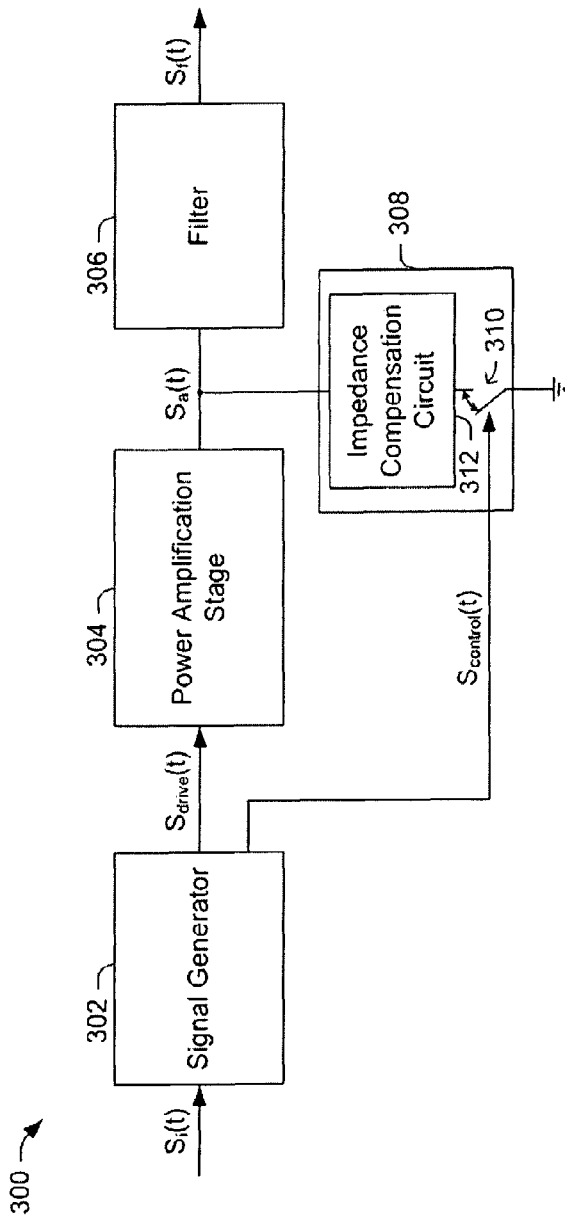
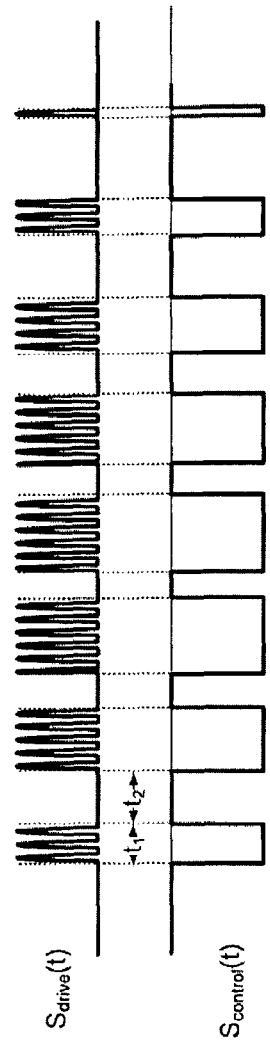
FIG. 3
FIG. 4

US 7,679,434 B2

AMPLIFIER MODULATION METHOD AND APPARATUS

FIELD OF INVENTION

The present invention relates generally to radio frequency (RF) modulation, and more particularly to modulation that employs impedance compensation circuitry.

BACKGROUND OF THE INVENTION

Generally, a power amplifier is a device that converts an input signal with a small amount of energy into a similar output signal with a larger amount of energy. For example, a power amplifier could receive an input signal with a relatively small amplitude and convert it to an output signal with a relatively large amplitude. Radio transmitters, such as base stations, cell phones and other communication devices, often use these power amplifiers to transmit communication signals between remote devices.

An ideal power amplifier would be a totally linear device, meaning that as a drive signal to the amplifier is increased, the output signal delivered by the amplifier also increases until a point is reached where some part of the amplifier becomes saturated and cannot produce any more output.

In some applications, such as in mobile communication devices, efficiency (low-power design) is also an important consideration in addition to linearity. Referring now to FIG. 1, one can see an example of a somewhat inefficient power amplifier 100. This power amplifier 100 includes a power amplification stage 102, a circulator 104, and a band-pass filter 106 that has an output coupled to a load ($R_L$). During operation, the power amplification stage 102 delivers a voltage over a wide bandwidth. The in-band frequency components flow through the circulator 104, pass through the pass band of the band-pass filter 106, and to the load $R_L$, as indicated by line 108. The out-of-band frequency components, however, see a high impedance at the band-pass filter 106 and are reflected back towards the circulator 104, which dissipates the power in a dump resistor 110, as indicated by line 112. This leads to lost power and a power amplifier with a relatively low efficiency.

As will be appreciated from the above discussion and embodiments described herein, there is an on-going need for power amplifiers that exhibit linearity as well as high efficiency.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment relates to a power amplifier that includes a switched mode power amplification stage. The power amplification stage has an output configured to provide an amplified output voltage as a function of a drive signal, where the drive signal fluctuates during a first time and is inactive during a second time. The power amplifier also includes impedance compensation circuitry coupled to the output of the power amplification stage. The impedance compensation circuitry can selectively alter an output impedance of the power amplification stage as a function of a control signal that is continuously de-asserted during the first time and continuously asserted during the second time.

The following description and annexed drawings set forth in detail certain illustrative aspects and implementations of the invention. These are indicative of only a few of the various ways in which the principles of the invention may be employed.

BRIEF DESCRIPTION OF THE DRAWINGS

FIG. 3 is a block diagram of one embodiment of a power amplifier that includes impedance compensation circuitry to limit non-linearities;

FIG. 4 is shows an example of one set of timing diagrams that are consistent with FIG. 3's embodiment;

DETAILED DESCRIPTION OF THE INVENTION

Figure 1:
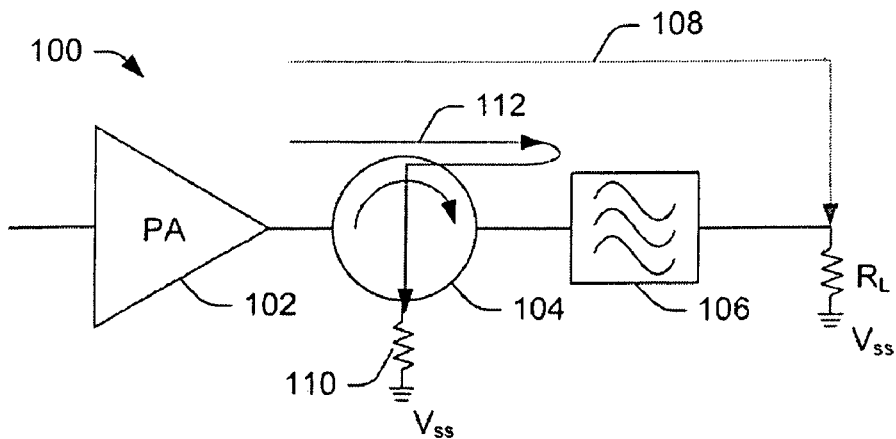
FIG. 1 is a schematic diagram illustrating an inefficient power amplifier in accordance with the prior art.

One or more implementations of the present invention will now be described with reference to the attached drawings, wherein like reference numerals are used to refer to like elements throughout. Although some illustrative examples are described below the context of amplitude modulation for the purposes of simplicity and clarity, it will also be appreciated that aspects of the invention as also application to other types of modulation, such as phase modulation.

Figure 2:
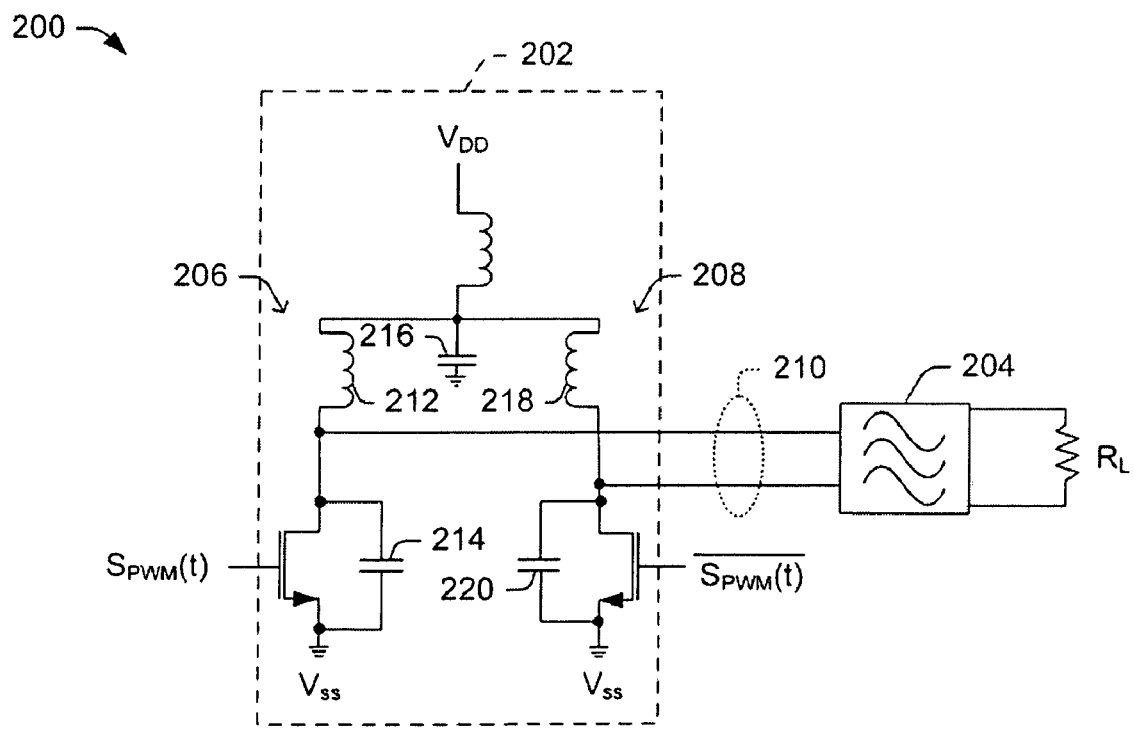
FIG. 2 is a schematic diagram illustrating one embodiment of a power amplifier with an increased efficiency but suffering from non-linearities.

In comparison to FIG. 1's inefficient power amplifier, FIG. 2 shows an embodiment of a power amplifier stage 202 and band-pass filter 204 where the reflected power is not dissipated over a dump resistor, but rather is stored within LC circuits 206, 208 in the power amplifier stage 202. By limiting power dissipation, the power amplifier 200 may have a higher efficiency that the previously discussed power amplifier 100. More specifically, FIG. 2's power amplifier stage 202 has a differential output 210 that transmits an amplified voltage as a function of time, where the amplified voltage has some frequency components that pass through the pass band of the band-pass filter 204 and other frequency components that are blocked by the upper or lower stop band of the band-pass filter 204. In essence, the out-of-band power sees a high impedance at the filter 204, and so the filter 204 reflects the out-of-band power back toward the power amplification stage 202. Due to the structure and frequency at which the power amplification stage 202 is operated, the out-of-band power is stored in the LC-circuits (e.g., inductor 212, capacitor 214, and capacitor 216; and inductor 218, capacitor 220, and capacitor 216) instead of being dissipated. Because LC circuits act as oscillators, the out-of-band power will be injected back into the system to limit power losses and allow fast response times.

However, while this solution may sound good in theory, in practical solutions the power amplifier stage 202 may exhibit a time-variant output impedance that causes non-linearity in the power amplifier 200. Unfortunately, many modern communication systems such as cellular systems, PCS systems, and satellite systems are built around linear amplification. Therefore, this power amplifier 200 is less than ideal.

Referring now to FIG. 3, one can see an embodiment of a power amplifier 300 that includes impedance compensation circuitry that can compensate for the time-variant output impedance in FIG. 2's embodiment, thereby providing a highly-efficient, linear power amplifier. To facilitate this functionality, the power amplifier 300 includes several components operably coupled together, namely, a signal generator 302, a power amplification stage 304, a filter 306, and impedance compensation circuitry 308. Note that although the power amplifier 300 is shown having a power amplification stage 304 with a single-ended output, aspects of the invention are also equally applicable to power amplification stages with differential outputs.

As FIG. 3 shows, the signal generator 302 receives an input signal, $S_i(t)$, which is to be modulated. Based on the input signal, $S_i(t)$, the signal generator 302 provides a drive signal, $S_{drive}(t)$, and a control signal, $S_{control}(t)$. Referring briefly to FIG. 4, one can see that the drive signal may fluctuate during a first time $t_1$ and be inactive during a second time $t_2$. The control signal could be continuously de-asserted during the first time $t_1$, and continuously asserted during the second time $t_2$. Although FIG. 4's drive signal is shown as a series of semi-sinusoidal waveforms, it could also be a series of square or rectangular waves.

Referring back to FIG. 3, the power amplification stage 304 receives the drive signal, $S_{drive}(t)$, often on the gate of a switching element (e.g., MOSFET) and delivers an amplified output voltage, $S_a(t)$, therefrom. Thus, the switching element may act as a time variant voltage source that delivers a voltage based on the drive signal. The power amplification stage 304 also typically includes at least one inductor-capacitor (LC) circuit to re-capture voltage components expected to be reflected towards its output from the filter 306.

With this in mind, the filter 306 works in conjunction with the power amplification stage 304 to deliver the amplified output voltage, $S_a(t)$. More specifically, the filter 306 allows some frequency components of the amplified output voltage to pass therethrough, but blocks (reflects) other frequency components towards the output of the amplification stage 304. The frequency components that pass through the filter 306 will constitute the filtered output signal, $S_f(t)$, as shown. The reflected components, by contrast, will have at least a portion of their energy stored in the LC circuit in the power amplification stage 304. These reflected components potentially allow the power amplifier 300 to have a relatively high efficiency and a relatively fast response time. To suitably account for these reflected components and limit non-linearities, the power amplifier 300 includes the impedance compensation circuitry 308 coupled to the output of the power amplification stage 304.

The impedance compensation circuitry 308 changes the effective output resistance of the power amplification stage 304 (as seen from the filter 306) as a function of the control signal, $S_{control}(t)$. The control signal controls a switching element 310 that selectively couples and decouples an impedance compensation circuit 312 to and from ground. In this manner, the impedance compensation circuitry 308 alters the effective output impedance the filter 306 sees when looking back towards the power amplification stage 304. In some embodiments, the impedance compensation circuit 312 will be structured so that the filter 306 sees a constant output impedance at all times when looking back towards the power amplification stage 304. This allows the impedance compensation circuitry 312 to help re-capture the reflected voltage components, thereby enabling higher efficiencies than previously achievable.

For example, in one embodiment the control signal could decouple the impedance compensation circuitry 312 from ground during time $t_1$ when the drive signal is active. By contrast, the control signal could couple the impedance circuitry 312 to ground during time $t_2$ when the drive signal is inactive. In other embodiments, the control signal could be used to change the output impedance in other manners.

Figure 5:
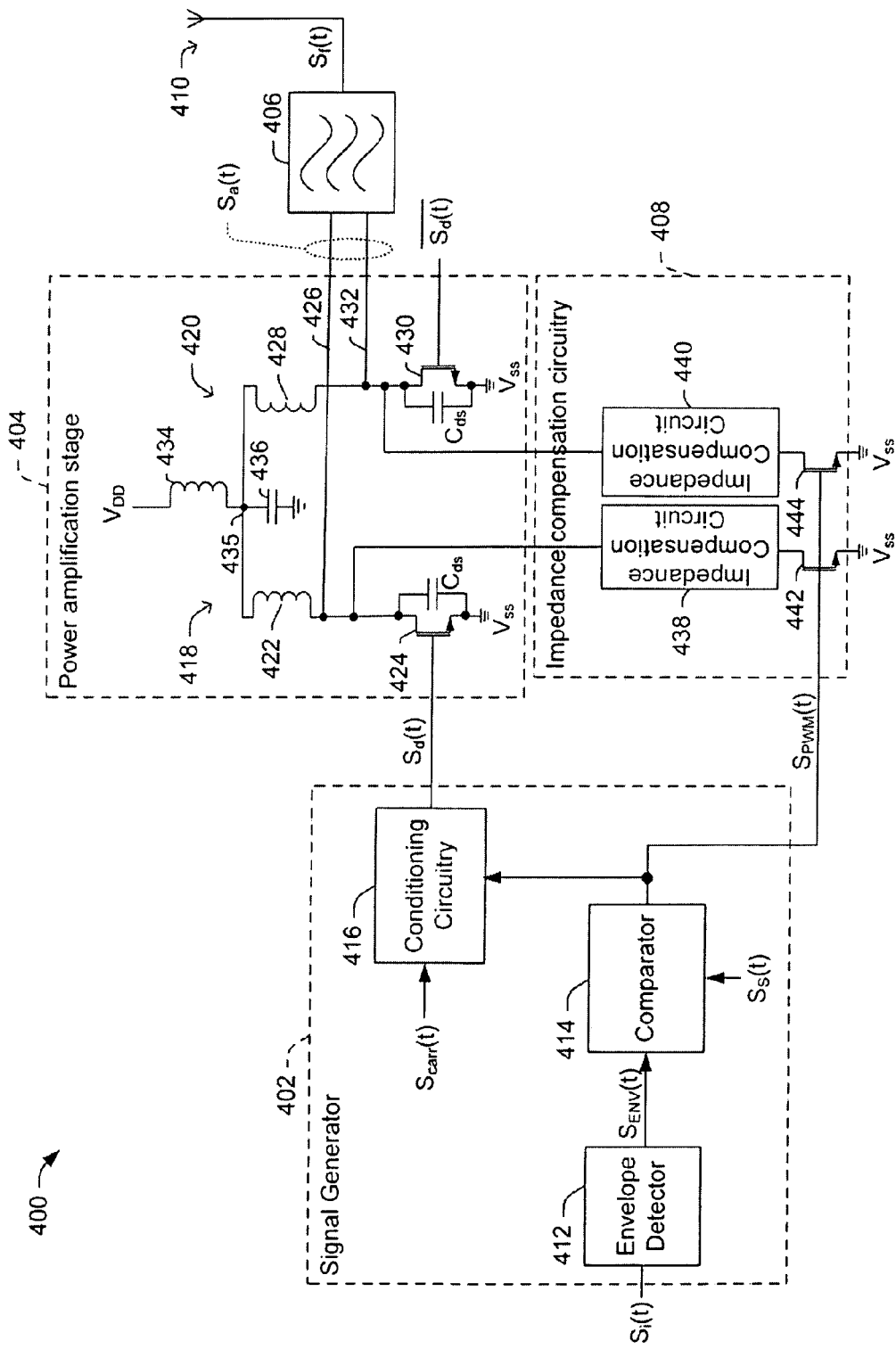
FIG. 5 is a schematic diagram of a portion of a radio transmitter that includes a more detailed embodiment of a power amplifier that includes impedance compensation circuitry to limit non-linearities.
Figure 6:
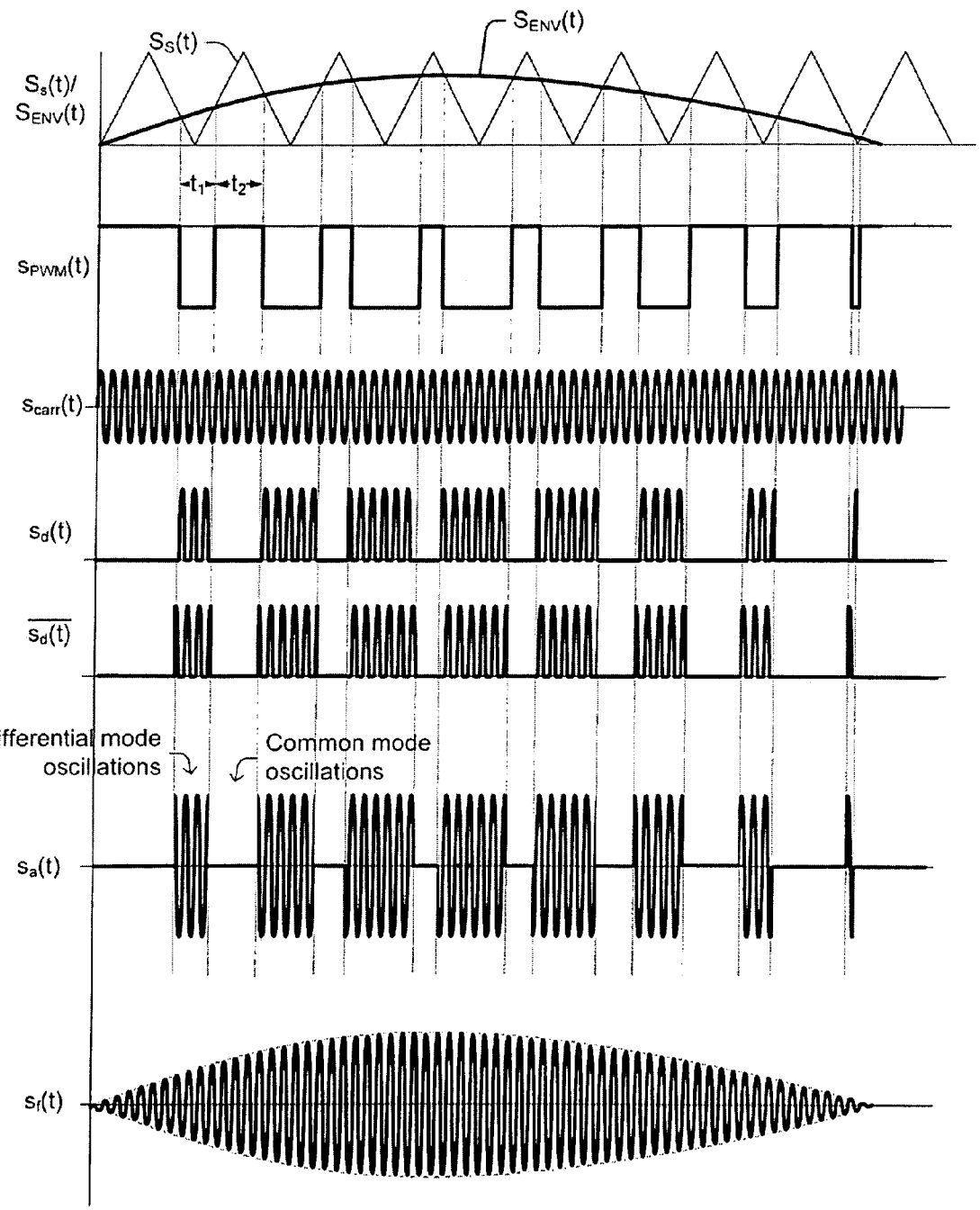
FIG. 6 is a series of timing diagrams in accordance with one example of signals that are consistent with FIG. 5's embodiment.

Now that a somewhat general description of a power amplifier 300 with impedance compensation circuitry 308 has been set forth, a more detailed embodiment of a power amplifier 400 is discussed along with accompanying timing diagrams in FIGS. 5-6. For purposes of illustration and clarity, this embodiment is shown in the context of a radio frequency transmitter that transmits wireless communication signals via an antenna, and includes a power amplification stage having a differential output. However, in other embodiments the power amplifier could be used in other contexts (e.g., audio amplifiers) and/or could be realized in a single-ended output configuration. A brief structural description is now set forth with reference to FIG. 5, after which the timing diagrams will be discussed with reference to FIG. 6.

As shown in FIG. 5, one can see a more detailed embodiment of a power amplifier 400 that includes a signal generator 402, a power amplification stage 404, a band-pass filter 406, and impedance compensation circuitry 408. In this embodiment, the power amplifier 400 could be configured to deliver its filtered output signal, $S_f(t)$, to an antenna 410 associated with, for example, a base station with a transmit power ranging from a few watts to several hundred watts.

The signal generator 402 receives an input signal, $S_i(t)$, and delivers the pulse-width modulation signal $S_{PWM}(t)$ and the drive signal, $S_d(t)$, based on a high-frequency sampling signal, $S_S(t)$, as well as a carrier wave signal, $S_{carr}(t)$. To facilitate this behavior, the signal generator 402 includes an envelope detector 412, a comparator 414, and conditioning circuitry 416. The envelope detector 412 receives the input signal $S_i(t)$ and provides an envelope signal $S_{env}(t)$, as a function thereof. The comparator 414 receives the envelope signal $S_{env}(t)$, as well as the sampling signal $S_S(t)$, and delivers a pulse-width modulation signal $S_{PWM}(t)$ based thereon. The conditioning circuitry 416 receives the pulse-width modulation signal, $S_{PWM}(t)$, and the carrier wave signal, $S_{carr}(t)$, and provides the drive signal, $S_d(t)$, (and optionally an inverse drive signal, $\overline{S_d(t)}$) therefrom. In some embodiments, the signal generator 402 may be implemented as a baseband processor that receives the input signal and extracts separate phase and amplitude information therefrom.

In the differential configuration shown, the power amplification stage 404 has first and second symmetric branches 418, 420 that are associated with the drive signals. The first branch 418 includes a first inductor 422 and a first MOSFET 424 having a parasitic capacitance $C_{ds}$, where the first MOSFET 424 receives the drive signal, $S_d(t)$, on its gate. The drain of the first MOSFET 424 and one terminal of the first inductor 422 are coupled to a first single-ended output node 426. The second branch 420 includes a second inductor 428 and a second MOSFET 430 having parasitic capacitance $C_{ds}$, where the second MOSFET 430 receives the inverse drive signal, $\overline{S_d(t)}$, on its gate. The drain of the second MOSFET 430 and one terminal of the second inductor 428 are coupled to a second single-ended output node 432. Thus, the first and second single-ended amplifier outputs 426, 432 taken together form a differential amplifier output on which an amplified output voltage, $S_a(t)$, is delivered. Because the drive signals ($S_d(t)$, $\overline{S_d(t)}$) are approximately 180° out of phase with one another, only one MOSFET is on at a given time when the drive signals are active (i.e., oscillating).

The power amplification stage 404 also includes a supply-side inductor 434 and a supply-side capacitor 436 symmetrically between the first and second symmetric branches 418, 420. The supply-side inductor 434 has one terminal coupled to a DC voltage supply ($V_{DD}$) and the other terminal coupled to an RF supply node 435. The supply-side capacitor 436 has one terminal coupled to the RF supply node 435 and its other terminal coupled to ground ($V_{SS}$).

In one embodiment, the first inductor 422 has an inductance of L/2 and the second inductor 428 also has an inductance of L/2, where L is given by:

$$L = \frac{1}{(2\pi f_c)^2 C_{ds}}$$

where $f_c$ is the frequency of the carrier wave signal. The inductance of the supply-side inductor 434 ($L_{DC}$) is typically selected so that $L_{DC} \gg L$. During amplifier operation, this configuration prevents or limits RF current draw from $V_{DD}$, but allows the RF supply node 435 to source RF currents via $V_{SS}$. As such, only DC current is drawn from $V_{DD}$, and RF currents are provided by the RF supply node.

Now the power amplification stage 404 has developed the amplified output signal, $S_a(t)$, at its differential output, the band-pass filter 406 receives the amplified output signal. The band-pass filter 406 allows in-band components to pass through to the antenna 410, but reflects out-of band components back to the differential output of the power amplification stage 404. Due to the structure and frequency at which the power amplifier is operated, the out-of-band power is stored in the LC-circuits (e.g., first inductor 422, supply-side capacitor 436, and capacitance $C_{ds}$; as well as second inductor 428, supply-side capacitor 436, and capacitance $C_{ds}$) and will be injected back into the system to limit power losses and allow fast response times. To further limit losses incurred in the power amplifier, the band-pass filter 406 may be a high-order air-cavity band-pass filter in one embodiment.

The impedance compensation circuitry 408 includes first and second symmetric impedance compensation circuits 438, 440 that are tied to the first and second singled ended outputs 426, 432, respectively. The impedance compensation circuitry 408 also includes third and fourth MOSFETs 442, 444 that selectively couple the first and second impedance compensation circuits, 438, 440 respectively, to ground as a function of the pulse-width modulated signal, $S_{PWM}(t)$. This way, when the drive signals, $S_d(t)$, $\overline{S_d(t)}$ have fluctuating amplitudes (i.e., are active), the third and fourth MOSFETs 442, 444 will decouple the first and second impedance compensation circuits 438, 440 from ground. Conversely, when the drive signals, $S_d(t)$, $\overline{S_d(t)}$ have constant amplitudes (i.e., are inactive), the third and fourth MOSFETs 442, 444 will couple the first and second impedance compensation circuits 438, 440 to ground. In this manner, the band-pass filter 406 sees a relatively constant output impedance at all times when looking back into the differential output of the power amplification stage 404.

Turning now to FIG. 6, one can see a more detailed series of waveforms described in the context of FIG. 5's embodiment. Note that these waveforms may be somewhat idealistic, and actual waveforms may vary from those shown.

The input signal, $S_i(t)$, which is to be modulated (not shown), may be received at the input of the signal generator 402. Generally, the input signal has a frequency that is much lower than that of the carrier wave, and will be upconverted to a higher frequency that is suitable for wireless transmission. Although FIG. 6 does not show the input signal, it does show an envelope signal, $S_{env}(t)$, derived therefrom.

For purposes of clarity, a triangular sampling signal, $S_S(t)$, is superimposed on the envelope signal to show one manner in which the comparator 414 can generate the PWM signal, $S_{PWM}(t)$. Although FIG. 6 shows a triangular sampling signal, a rectangular sampling signal or any other sampling signal could also be used.

As shown, the PWM signal $S_{PWM}(t)$ is established when the comparator 414 compares the envelope signal $S_{env}(t)$ to the sampling signal $S_S(t)$. Consequently, $S_{PWM}(t)$ has a duty cycle that varies as a function of the amplitude (envelope) of the input signal $S_i(t)$. As shown, $S_{PWM}(t)$ is continuously de-asserted during a first time $t_1$, and continuously asserted during a second time $t_2$. Although $S_{PWM}(t)$ is shown as continuously asserted or continuously de-asserted, $S_{PWM}(t)$ could also have slight non-continuities which are also contemplated as constituting legal equivalents thereof.

A carrier wave signal $S_{carr}(t)$ is received by the conditioning circuitry 416 along with the PWM signal. Often, the carrier wave signal has a relatively high frequency relative to the pulse width modulation and input signals. In the illustrated embodiment, the carrier wave could have a frequency that falls within the RF frequency range. For example, depending on the implementation, the carrier frequency could range from a few kilohertz up to many gigahertz. Although not illustrated, the carrier wave could also be phase modulated.

The conditioning circuitry 416 multiplies the PWM signal and the carrier wave signal to produce the drive signal $S_d(t)$ as shown. Thus, the drive signal is fluctuating during the first time $t_1$ and inactive during the second time $t_2$. An inverse drive signal $\overline{S_d(t)}$ can also be established in a similar manner, where the inverse drive signal is approximately 180° phase shifted relative to the drive signal.

A differential amplified output voltage $S_a(t)$ will be provided at the differential output of the power amplification stage 404. While the drive signals are active (e.g., during $t_1$), the differential amplified output voltage is delivered from the amplification stage. This differential amplified output voltage is obtained by taking the difference between the voltages on the first and second single-ended outputs.

A filtered output signal, $S_f(t)$, is generated when the band-pass filter allows the in-band frequency components to pass therethrough. Thus, the filtered output signal, $S_f(t)$, is essentially a modulated version of the input signal $S_i(t)$.

While the drive signals are active (e.g., during $t_1$), the singled ended outputs 426, 432 will have differential mode oscillations that run out-of phase with one another. Conversely, when the drive signals are inactive (e.g., during $t_2$), the single-ended outputs 426, 432 are coupled together by the filter 406, and will fall into a common mode oscillation pattern. These common mode oscillations preserve most of the energy the band-pass filter reflects back towards the power amplification stage. This energy is used to accelerate operation of the power amplifier when the conditioned PWM signals are re-activated, thereby improving amplifier response time and efficiency.

Figure 7:
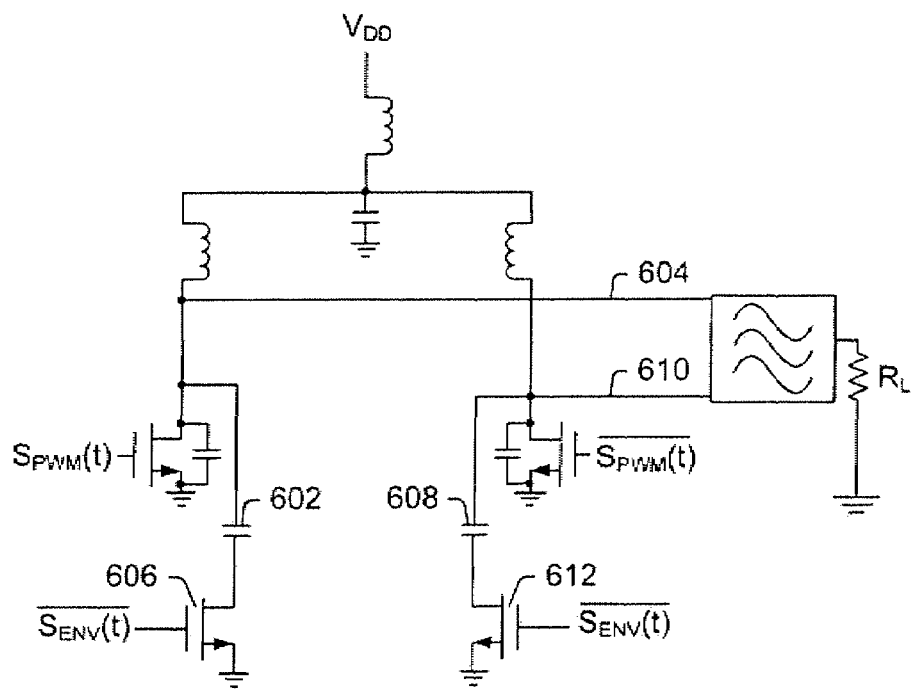
FIG. 7 is a schematic diagram illustrating a power amplifier with an example of more detailed impedance compensation circuitry.
Figure 8:
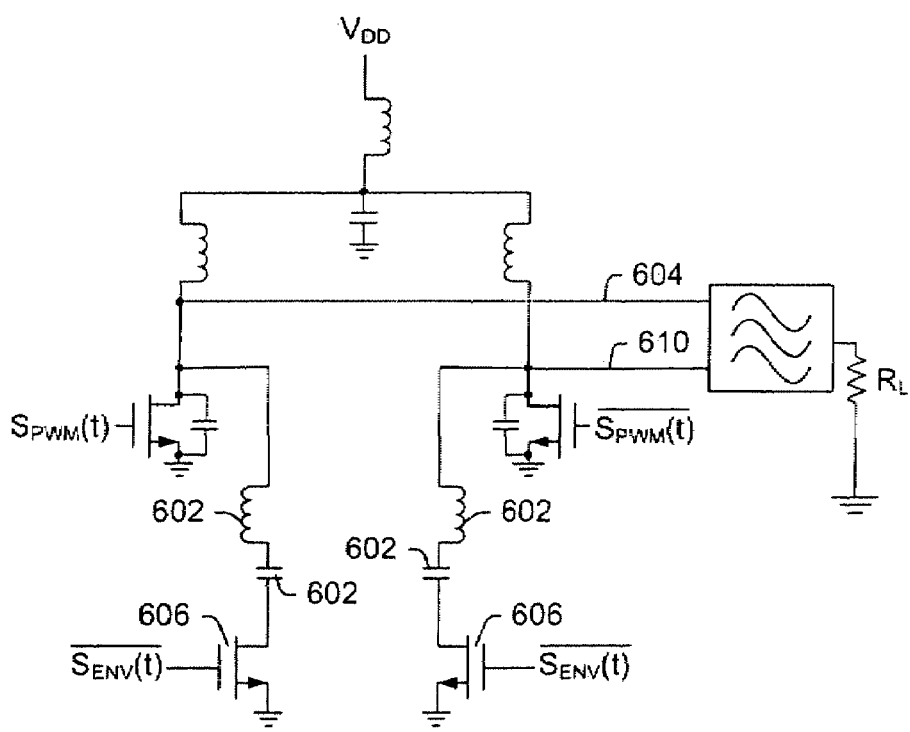
FIG. 8 is a schematic diagram illustrating a power amplifier with an example of more detailed impedance compensation circuitry.
Figure 9:
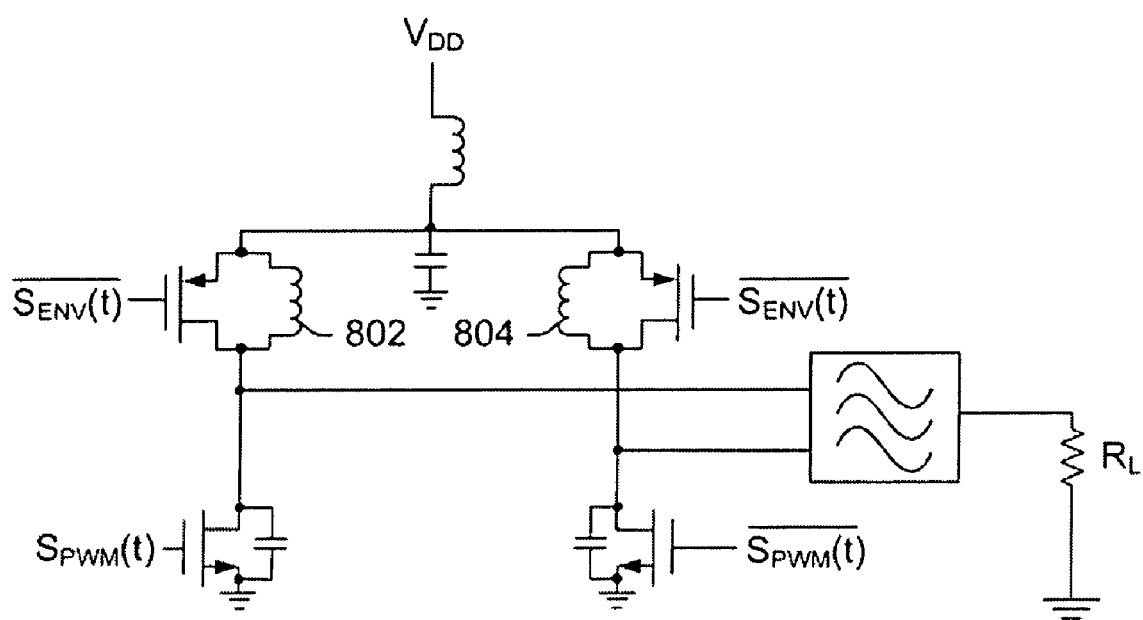
FIG. 9 is a schematic diagram illustrating a power amplifier with an example of more detailed impedance compensation circuitry.

Referring now to FIG. 7-9, one can see several more detailed examples of circuits that could be used for the impedance compensation circuitry 408. For example, FIG. 7 shows an embodiment of a wide band switch where the first impedance compensation circuit 438 includes a first capacitor 602 coupled between a first single-ended output 604 and a third MOSFET 606; and the second impedance compensation circuit 440 includes a second capacitor 608 coupled between a second single-ended output 610 and a fourth MOSFET 612.

FIG. 8 shows an embodiment of a narrow band switch. In this embodiment, the first impedance compensation circuit 438 includes a first LC circuit that includes a first capacitor 702 in series with a third inductor 704. The second impedance compensation circuit 440 includes a second LC circuit that includes a second capacitor 706 in series with a fourth inductor 708.

FIG. 9 shows another embodiment where a first impedance compensation circuit selectively couples and decouples a first inductor 802 from the power amplification stage as a function of the pulse-width modulated signal. Similarly, a second impedance compensation circuit selectively couples and decouples a second inductor 804 from the power amplification stage as a function of the pulse-width modulated signal.

Figure 10:
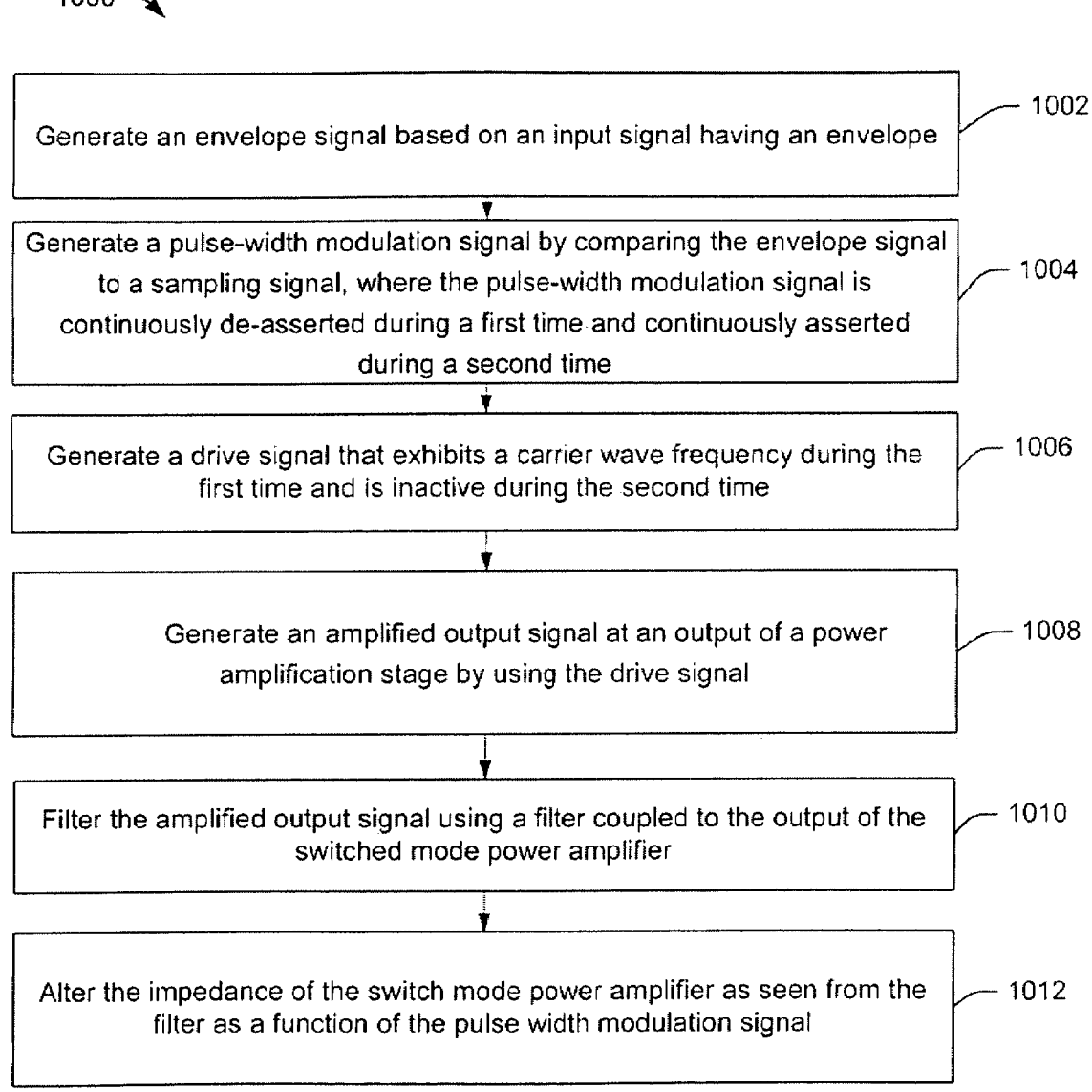
FIG. 10 is a flowchart illustrating an method of modulating an input signal in accordance with one embodiment of the present invention.

Referring now to FIG. 10, one can see a method for modulating an input signal in accordance with some aspects of the invention. While the method is illustrated and described below as a series of acts or events, the present invention is not limited by the illustrated ordering of such acts or events. For example, some acts may occur in different orders and/or concurrently with other acts or events apart from those illustrated and/or described herein. In addition, not all illustrated steps may be required to implement a methodology in accordance with one or more aspects of the present invention. Further, one or more of the acts depicted herein may be carried out in one or more separate acts or phases.

In FIG. 10, the method 1000 starts at 1002 when an envelope signal is generated based on an input signal having an envelope.

In 1004, a pulse-width modulation signal is generated by comparing the envelope signal to a sampling signal, where the pulse-width modulation signal is continuously de-asserted during a first time and continuously asserted during a second time.

In 1006, a drive signal is generated that exhibits a carrier wave frequency during the first time and is inactive during the second time.

In 1008, an amplified output signal is generated at an output of a power amplification stage by using the drive signal.

In 1008, the amplified output signal is filtered using a filter coupled to the output of the power amplification stage; and In 1010, an output impedance of the power amplification stage is altered as seen from the filter as a function of the pulse-width modulation signal.

As will be appreciated by one of ordinary skill in the art, this method 1000 may be combined with other features of the previously discussed embodiments.

Some methods and corresponding features of the present disclosure can be performed by hardware modules, software routines, or a combination of hardware and software. To the extent that software is employed, for example by a baseband processor or other processor associated with the power amplifier, the software may be provided via a "computer readable medium", which includes any medium that participates in providing instructions to the processor. Such a computer readable medium may take numerous forms, including but not limited to, non-volatile media, volatile media, and transmission media. Non-volatile media includes, for example, optical disks (such as CDs, DVDs, etc.) or magnetic disks (such as floppy disks, tapes, etc.). Volatile media includes dynamic memory, such as ferroelectric memory, SRAM, or DRAM. Transmission media includes coaxial cables, copper wire, fiber optics, etc. that could deliver the instructions over a network or between communication devices. Transmission media can also include electromagnetic waves, such as a voltage wave, light wave, or radio wave.

Although the invention has been illustrated and described with respect to one or more implementations, alterations and/or modifications may be made to the illustrated examples without departing from the spirit and scope of the appended claims. For example, although some of the embodiments described herein are illustrated and discussed with respect to MOSFETS, it will be appreciated that other switching elements could also be used. These switching elements could include high electron mobility transistors (HEMTs), bipolar junction transistors (BJTs), lateral diffused metal oxide semiconductor (LDMOS) transistors, vacuum tubes, and other types of switching elements.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A power amplifier, comprising:
   a switched mode power amplification stage having an output configured to provide an amplified output voltage as a function of a drive signal, where the drive signal fluctuates during a first time and is inactive during a second time; and
   impedance compensation circuitry coupled to the output of the power amplification stage and configured to selectively alter an output impedance of the power amplification stage as a function of a control signal that is driven at a first state during the first time and driven at a second, different state during the second time.

2. The power amplifier of claim 1, where the switched mode power amplification stage includes an inductor-capacitance circuit, further comprising:
   a filter coupled to the output of the power amplification stage and configured to pass some frequency components of the amplified output voltage to an output of the filter and reflect other frequency components of the amplified output voltage, where at least some energy of the reflected frequency components is stored in the inductor-capacitor circuit during the second time.

3. The power amplifier of claim 1, where the impedance compensation circuitry keeps the output impedance of the power amplification stage approximately constant over the first and second times.

4. The power amplifier of claim 1, where the power amplification stage provides the amplified output voltage in differential format via first and second symmetric branches of the power amplification stage output as a function of the drive signal and an inverse drive signal that is approximately 180° out-of-phase with respect to the drive signal.

5. The power amplifier of claim 1, where the power amplification stage provides the amplified output voltage in single-ended format and comprises:
   a first switching element including: a gate on which the drive signal is received, a source tied to ground, and a drain tied to the output of the power amplification stage;
   a supply-side inductor in series with a capacitor with a radio frequency supply node between the supply-side inductor and capacitor, the supply-side inductor having a terminal tied to a DC supply voltage and the capacitor having a terminal tied to ground; and
   a first inductor coupled between the radio frequency supply node and the output of the power amplification stage.

6. The power amplifier of claim 1, where the impedance compensation circuitry comprises:
   an impedance compensation circuit having one node coupled to the output of the power amplification stage and having an other node coupled to a switching element that selectively couples the other node of the impedance compensation circuit to ground as a function of the control signal.

7. A power amplifier, comprising:
   a signal generator configured to receive an input signal having an envelope and configured to provide: a drive signal that is modulated with a carrier wave during a first time and inactive during a second time, and a pulse-width modulation signal that is driven at a first state during the first time and driven at a second, different state during the second time; and
   a switched mode power amplification stage configured to, in conjunction with a filter coupled between a differential output of the power amplification stage, provide an amplified output voltage at the differential output as a function of the drive signal and an inverse drive signal; and
   impedance compensation circuitry coupled to the differential output of the power amplification stage and configured to selectively alter an output impedance of the power amplification stage as a function of the pulse-width modulation signal.

8. The method of claim 7, where the filter provides a filtered signal that is modulated with the carrier wave and that has an envelope that is similar to the envelope of the input signal.

9. The power amplifier of claim 7, where the power amplification stage comprises:
   a first switching element controlled via the drive signal and coupled to a first single-ended output of the differential output;
   a second switching element controlled via the inverse drive signal and coupled to a second single-ended output of the differential output; and
   where the filter is coupled between the first and second single-ended outputs.

10. The power amplifier of claim 9, where the power amplification stage further comprises:
    a supply-side inductor in series with a capacitor where a radio frequency supply node is between the supply-side inductor and the capacitor, the supply-side inductor having a terminal tied to a DC supply voltage and the capacitor having a terminal tied to ground;
    a first inductor coupled between the radio frequency supply node and the first single-ended output;
    a second inductor coupled between the radio frequency supply node and the second single-ended output.

11. The power amplifier of claim 9, where the impedance compensation circuitry comprises:
    a first impedance compensation circuit having a first node coupled to the first single ended output of the power amplification stage and having a third node coupled to a third switching element that selectively couples the third node of the impedance compensation circuit to ground as a function of the pulse-width modulation signal; and
    a second impedance compensation circuit having a second node coupled to the second single ended output of the power amplification stage and having a fourth node coupled to a fourth switching element that selectively couples the fourth node of the impedance compensation circuit to ground as a function of the pulse-width modulation signal.

12. The power amplifier of claim 9, where the impedance compensation circuitry comprises:
    a first impedance compensation circuit that includes a first capacitor; and
    a third switching element having a gate on which the pulse-width modulation signal is applied and in series with the first capacitor.

13. The power amplifier of claim 9, where the impedance compensation circuitry comprises:
    a first impedance compensation circuit that includes a first capacitor in series with a first inductor; and
    a third switching element having a gate on which the pulse-width modulation signal is applied and in series with the first capacitor and first inductor.

14. The power amplifier of claim 7, where the signal generator comprises:
    an envelope detector configured to receive the input signal and provide an envelope signal therefrom;
    a comparator configured to receive the envelope signal and provide the pulse-width modulation signal therefrom;
    conditioning circuitry configured to logically relate the pulse-width modulation signal with a carrier wave and thereby provide the drive signal.

15. A method for modulating an input signal, comprising:
    generating an envelope signal based on an input signal having an envelope;
    generating a pulse-width modulation signal by comparing the envelope signal to a sampling signal, where the pulse-width modulation signal is driven at a first state during a first time and driven at a second, different state during a second time;
    generating a drive signal that exhibits a carrier wave frequency during the first time and is inactive during the second time;
    generating an amplified output signal at an output of a power amplification stage by using the drive signal;
    filtering the amplified output signal using a filter coupled to the output of the power amplification stage; and
    altering an output impedance of the power amplification stage as seen from the filter as a function of the pulse-width modulation signal.

16. The method of claim 15, where the amplified output signal comprises differential mode oscillations during the first time and common mode oscillations during the second time.

17. The method of claim 15, where altering the output impedance of the power amplification stage comprises:
opening or closing a switching element coupled to an impedance compensation circuit tied to the output of the power amplification stage.

18. The method of claim 15, where the filtered signal is modulated with the carrier wave frequency and that has an envelope that is similar to the envelope of the input signal.

19. A radio frequency transmitter, comprising:
an envelope detector configured to receive the input signal and provide an envelope signal therefrom;
a comparator configured to receive the envelope signal and provide a pulse-width modulation signal that is continuously do asserted driven at a first state during a first time and driven at a second, different state during a second time;
conditioning circuitry configured to logically relate the pulse-width modulation signal with a carrier wave and thereby provide a drive signal;
a power amplification stage configured to provide an amplified output voltage at a first singled ended output, comprising: a first MOSFET for providing the amplified output voltage as a function of the conditioned pulse-width modulation signal;
a filter coupled to the first single-ended output branch and configured to provide a filtered output signal, the filtered output signal having a envelope that is similar to that of the input signal and having a frequency that is greater than that of the input signal; and
first impedance compensation circuitry coupled to the first single-ended output and including a third switching element configured to selectively alter an output impedance of the power amplification stage as a function of the pulse-width modulation signal.

20. The radio frequency transmitter of claim 19, where the filter is a high-order air cavity base band filter.

21. The radio frequency transmitter of claim 19, where the power amplification stage further comprises:
a second switching element for providing the amplified output voltage along a second single-ended output branch of the power amplification stage as a function of an inverse pulse-width modulation signal that is 180° phase shifted relative to the pulse-width modulation signal; and
second impedance compensation circuitry coupled to the second single-ended output branch and including a fourth switching element for selectively coupling the second impedance compensation circuitry to ground as a function of the pulse-width modulation signal.

22. The radio frequency transmitter of claim 21, where the filter is coupled between the first and second single-ended output branches.

23. The radio frequency transmitter of claim 22, further comprising:
an antenna configured to receive the filtered output signal and transmit the filtered output signal.

24. A power amplifier, comprising:
signal generator means for receiving an analog input signal and for providing a drive signal that is modulated with a carrier wave during a first time and inactive during a second time, and a pulse-width modulation signal that is driven at a first state during the first time and driven at a second, different state during the second time;
power amplification means for providing an amplified output voltage as a function of the drive signal; and
impedance compensation means for selectively altering an output impedance of the power amplification means as a function of the pulse-width modulation signal.

25. The power amplifier of claim 24, further comprising:
filtering means for passing in-band frequency components of the amplified output voltage to generate a filtered output signal and for reflecting out-of-band frequency components of the amplified output voltage back towards the power amplification means.

* * * * *